INVENTORS
MASAYOSHI NOMURA, MINORU NAGATA
and HIROJI SAIDA
BY Craig, Antonelli, Stewart & Hill
ATTORNEYS INVENTORS
MASAYOSHI NOMURA, MINORU NAGATA
and HIROJI SAIDA BY Craig, Antonelli, Stewart & Hill
ATTORNEYS INVENTORS
MASAYOSHI NOMURA, MINORU NAGATA
and HIROJI SAIDA
BY
Craig, Antonelli, Stewart & Hill
ATTORNEYS INVENTORS
MASAYOSHI NOMURA, MINORU NAGATA
and HIROJI SAIDA BY
Craig, Antonelli, Stewart & Hill
ATTORNEYS Oct. 9, 1973 MASAYOSHI NOMURA ET AL 3,764,409

METHOD FOR FABRICATING A SEMICONDUCTOR COMPONENT FOR A SEMICONDUCTOR CIRCUIT

Filed Sept. 29, 1969 10 Sheets-Sheet 5

INVENTORS

MASAYOSHI NOMURA, MINORU NAGATA and HIROJI SAIDA

BY Craig, Antonelli, Stewart & Hill

ATTORNEYS

INVENTORS
MASAYOSHI NOMURA, MINORU NAGATA
and HIROJI SAIDA

BY
Craig, Antonelli, Stewart & Hill
ATTORNEYS

INVENTORS
MASAYOSHI NOMURA, MINORU NAGATA
and HIROJI SAIDA

BY
[signature]
ATTORNEYS

INVENTORS
MASAYOSHI NOMURA, MINORU NAGATA
and HIROJI SAIDA

BY
Craig, Antonelli, Stewart & Hill
ATTORNEYS

INVENTORS
MASAYOSHI NOMURA, MINORU NAGATA
and HIROJI SAIDA
BY
ATTORNEYS

Oct. 9, 1973 MASAYOSHI NOMURA ET AL 3,764,409

METHOD FOR FABRICATING A SEMICONDUCTOR COMPONENT FOR A SEMICONDUCTOR CIRCUIT

Filed Sept. 29, 1969 10 Sheets-Sheet 10

INVENTORS

MASAYOSHI NOMURA, MINORU NAGATA and HIROJI SAIDA

BY Craig, Antonelli, Stewart & Hill

ATTORNEYS 3,764,409
Patented Oct. 9, 1973

1

3,764,409

METHOD FOR FABRICATING A SEMICONDUCTOR COMPONENT FOR A SEMICONDUCTOR CIRCUIT

Masayoshi Nomura, Kokubunji-shi, Minoru Nagata, Kodaira-shi, and Hiroji Saida, Hachioji-shi, Japan, assignors to Hitachi, Ltd., Tokyo, Japan Filed Sept. 29, 1969, Ser. No. 861,921
Claims priority, application Japan, Sept. 30, 1968, 43/70,127, 43/70,128; Feb. 17, 1969, 44/11,043; Feb. 26, 1969, 44/13,893; Mar. 22, 1969, 44/21,254; Mar. 27, 1969, 44/22,690; Mar. 31, 1969, 44/23,793
Int. Cl. H01l 7/36, 7/50, 19/00
U.S. Cl. 148—175 21 Claims

ABSTRACT OF THE DISCLOSURE

A silicon substrate of one conductivity type covered with a silicon nitride masking layer having an aperture is vapor-etched to have a hollow part therein and then heat treated in a mixture gas of HCl, $SiCl_4$, $H_2$ and one active impurity with a second conductivity type opposite to that of the substrate, so that a silicon epitaxial layer of the second conductivity type is epitaxially grown only on the surface of the hollow part in such a manner to refill the hollow part, thereby making the silicon epitaxial layer operable as a resistance element in the substrate with a pn junction formed therein according to this method.

BACKGROUND OF THE INVENTION

Field of the invention

This invention relates to a method for forming a semiconductor component of a semiconductor circuit, and more particularly to a method for forming a semiconductor component such as a transistor, a diode, a resistor and a combination thereof, which is constructed in the epitaxial layer grown selectively upon the surface of a semiconductor substrate.

Description of the prior art

It has been practiced in the manufacture of transistors, diodes, and IC (integrated circuits) to grow a very thin semiconductor epitaxial layer from the vapor phase on the surface of a semiconductor or in the surface thereof and to form a desired pn junction in this growth layer, whereby a circuit component for a semiconductor circuit, e.g. IC and LSI( large scale integration), is fabricated.

There are two known methods for forming an epitaxial layer on a prescribed position of the surface of a semiconductor susbtrate. The first method is to form an $SiO_2$ film having an aperture on the surface of a silicon single crystal substrate and thereafter form a semiconductor layer on the surface portion of the semiconductor substrate exposed by the aperture using the $H_2$ reduction of $SiCl_4$. The second method is to form a hollow in the surface portion of the semiconductor substrate exposed by the aperture in the $SiO_2$ film by vapor etching or chemical solution etching, and grow a semiconductor layer in this hollow part from the vapor phase.

Both these methods assume an ideal form of the epitaxial growth, but are still impractical due to an increase in the diameter of aperture in the $SiO_2$ film during the formation of the epitaxial layer, an increase in the density and the diameter of pinholes in the $SiO_2$ film, the formation of polycrystal masses on the $SiO_2$ surface, and the unevenness on the surface of the semiconductor substrate.

SUMMARY OF THE INVENTION

The object of this invention is to provide an improved method of preferential epitaxial growth capable of obtaining an epitaxial layer substantially free from crystal defects.

2

Another object of this invention is to provide an improved method for fabricating a refilled epitaxial layer having a surface flat enough to enable the application of the planar technique to this epitaxial layer.

A further object of this invention is to provide an improved method for fabricating an epitaxial layer, where no decrease is seen in the thickness of the protective film or the mask during the growth of the epitaxial layer on the selected surface portion of a semiconductor while no increase in the pinhole density in the film occurs.

Still another object of this invention is to disclose a vapor reaction atmosphere, where the epitaxial layer is formed only on the surface portion of a semiconductor substrate exposed by the aperture of the mask allowing no deposition of semiconductor materail on the mask.

Another object of this invention is to provide a method for fabricating a transistor in the epitaxial layer by forming a hollow in a portion of the semiconductor substrate and performing the epitaxial growth of a semiconductor in the hollow portion.

Another object of this invention is to provide a method for fabricating semiconductor resistance elements suitable for a semiconductor IC.

Another object of this invention is to provide an improved method for fabricating transistors and resistance circuit elements using a preferential epitaxial layer.

The gist of this invention is to coat a silicon nitride film on the surface of a semiconductor substrate, perforating an aperture in a prescribed position of the film, thereby to grow a semiconductor by vapor growth on the portion of the semiconductor substrate exposed in the aperture; and if necessary to form a hollow in the silicon substrate exposed in the aperture portion of the silicon nitride film by the etching technique, to grow a semiconductor by vapor growth in this hollow portion. More, the present invention relates to a fabrication method of a circuit component for a semiconductor integrated circuit, where the semiconductor material is prevented from depositing on the silicon nitride film during the vapor phase growth by mixing HCl gas into the reaction gas.

The silicon nitride film, known as a protection film, has been found to have an excellent feature when used as a mask for the epitaxial method. Namely, the film is proof against a reaction atmosphere containing $H_2$, $SiCl_4$ and HCl. Whereas in the $SiO_2$ film a decrease in thickness during the formation of the epitaxial layer and an increase in the density and the diameter of pinholes occur, the silicon nitride film is free from such phenomena.

Other objects, features and advantages will be readily understood from the following detailed description with reference to the accompanying drawings.

DESCRIPTION OF THE PREFERRED EMBODIMENTS

In order to understand this invention fully a brief description of the prior art methods will be made first with reference to the drawings.

Figure 1:
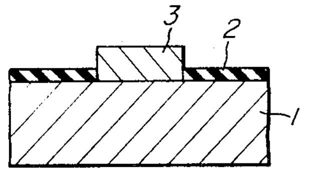
FIGS. 1 and 2 are explanatory views of selective vapor phase growth of silicon on the surface of a silicon substrate by known methods.

The epitaxial layer formed by the afore-mentioned first method of prior art is as shown in FIG. 1, where 1 is a semiconductor substrate, e.g. silicon single crystal, of an N or P conductivity type whose principal surface is usually in the [111] plane. Numeral 2 is an $SiO_2$ film provided on one principal surface of the silicon substrate. The usual method of forming this $SiO_2$ film is the oxidation of the silicon substrate or the thermal decomposition of monosilane. Numeral 3 is a silicon epitaxial layer grown epitaxially in the aperture portion of the $SiO_2$ film. Although in the figure the $SiO_2$ film 2 and the epitaxial layer 3 are drawn enlarged for the sake of explanation, actually the substrate 1 is 100 to 500$\mu$ thick, the $SiO_2$ film 2 is less than 1$\mu$ thick, and the epitaxial layer *5* to 7$\mu$ thick. The structure as shown in FIG. 1 is utilized for a mesa type semiconductor device (diode transistor).

Figure 2:
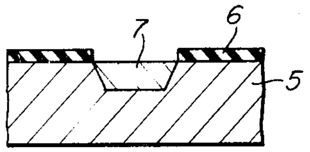

According to the second method of the prior art, an $SiO_2$ film with an aperture is formed on one principal surface of a silicon single crystal surface and then the surface portion of the silicon crystal substrate exposed by the aperture section is hollowed by means of vapor or solution etching. An epitaxial layer is grown in the hollow portion. FIG. 2 shows schematically the refilled epitaxial layer thus obtained. 5 is the silicon substrate of an N or P type conductivity whose principal surface is the [111] face. Numeral 6 is an $SiO_2$ film having an aperture portion in which the refilled epitaxial layer 7 is formed. The surface of the refilled epitaxial layer is grown substantially to the same level as that of the surface of the silicon substrate. Further, the side faces of the epitaxial layer are arranged to make contact with the silicon crystal. Therefore, the crystallity of the grown crystal layer becomes considerably higher than that of FIG. 1.

In both the above-mentioned methods, the formation of the $SiO_2$ film is made by a known method. The manufacturing method of the epitaxial layer is usually done by the $H_2$ reduction of $SiCl_4$. However, as another method the thermal decomposition of monosilane is reported to be applicable.

Although the above-mentioned two epitaxial methods assume an ideal form, they are still below the practical level for the following reasons.

Figure 3:
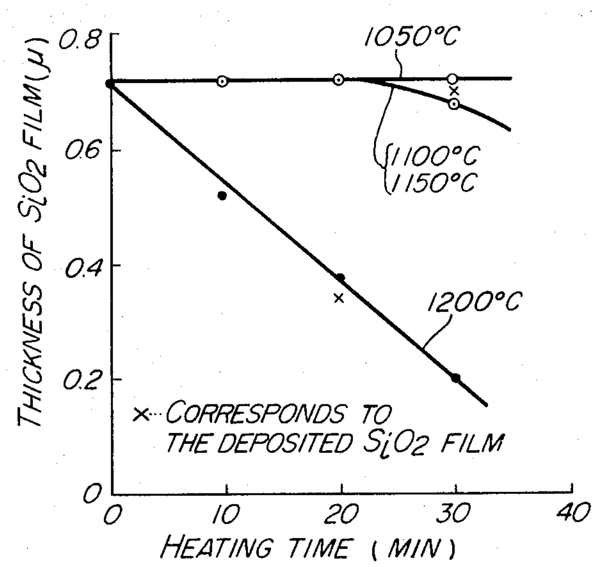
FIG. 3 shows the relation between the heating time and the thickness of $SiO_2$ layers treated in an $H_2$ atmosphere.

(1) Common to both methods the reaction atmosphere contains $H_2$. Therefore, during the formation of the preferential epitaxial layer the thickness of the $SiO_2$ film used as a mask decreases while the diameter of the aperture portion increases. FIG. 3 shows the experimental results showing how the $SiO_2$ film decreases in the $H_2$ atmosphere. The film thickness varies remarkably with the temperature of the atmosphere. Especially above 1200° C. the decrease in thickness becomes considerably large. This tendency does not differ much with the various formation methods of the $SiO_2$ film.

Figure 4:
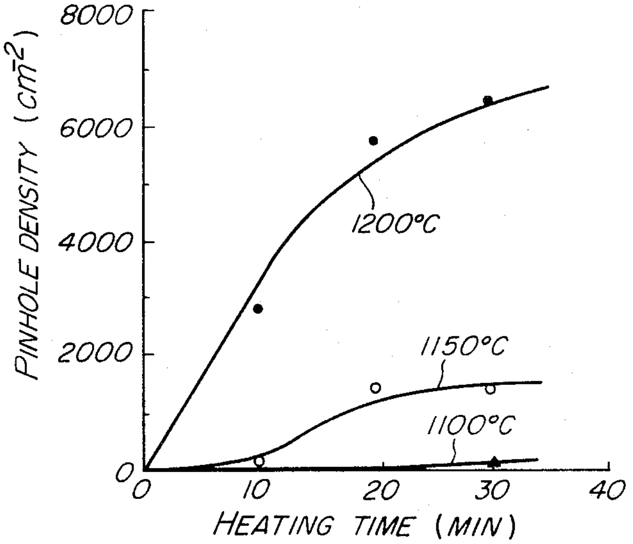
FIG. 4 shows the relation between the heating time and the pinhole density in the $SiO_2$ layer treated in an $H_2$ atmosphere.

(2) Heating in an $H_2$ atmosphere increases the density and the diameter of the pinholes. FIG. 4 shows the increase in the pinhole density in the $SiO_2$ film when a sample with an $SiO_2$ film having a thickness of 7200 A. and an aperture of 600 $\mu\phi$ in the [111] plane are disposed in an $H_2$ atmosphere having a flow of 25 l./m. flow and subjected to heat treatment. The number of pinholes is seen to increase with the temperature of the heat treatment.

Figure 5:
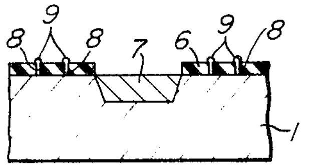
FIGS. 5 and 6 are longitudinal sectional views where preferential epitaxial layers are grown with the $SiO_2$ layer as a masking layer.
Figure 6:
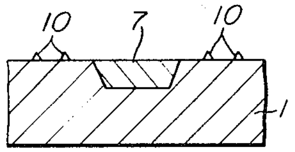

(3) With the increase in the pinhole density of the $SiO_2$ film the diameter of the aperture also increases. During the process of the refilled epitaxial growth polycrystals are deposited on the $SiO_2$ film. Penetrating the pinholes, there are grown from the surface of the semiconductor substrate toward the surface of the $SiO_2$ film, forming polycrystalline masses on the surface. FIGS. 5 and 6 show this state appearing in the second prior art method. Numerals 1, 6 and 7 are the silicon substrate, the $SiO_2$ film on the surface, and the epitaxial layer respectively. 8 shows the silicon polycrystals grown through the pinholes in the $SiO_2$ film as far as the surface of the substrate. Numeral 9 shows the polycrystal masses grown exposed on the surface of the $SiO_2$ film through the pin holes. The number of polycrystalline masses 9 increases in proportion to the number of pinholes in the $SiO_2$ film. The polycrystalline masses 9 on the $SiO_2$ film become seed crystals during the process of forming the refilled epitaxial layer, causing a polycrystalline layer on the $SiO_2$ film. Even though the $SiO_2$ film used as a mask is removed completely by a chemical solution after the formation of the refilled epitaxial layer in order to eliminate the polycrystals, the existence of a large number of projections (with a height of from a few $\mu$ to a dozen $\mu$) brings about unfavorable influences upon the later treatments such as the formation of a new $SiO_2$ film and the coating of a photoresist.

As a countermeasure to prevent the polycrystals on the $SiO_2$ film it is proposed to reduce the epitaxial growth rate, utilizing the reaction between the silicon polycrystallites and the $SiO_2$ film in order to remove the polycrystallites in vapor. This method, however, cannot get rid of the above difficulties, which necessarily occur so long as the $SiO_2$ film is used as a mask.

Figure 7:
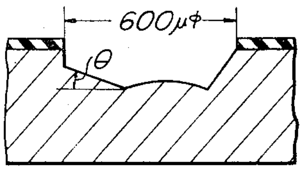
FIGS. 7 and 8 are longitudinal sectional views where epitaxial layers are grown in a hollow formed in the [111] plane of a silicon substrate.
Figure 8:
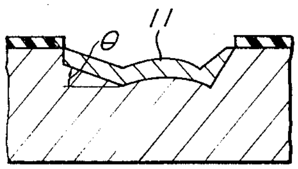
Figure 9:
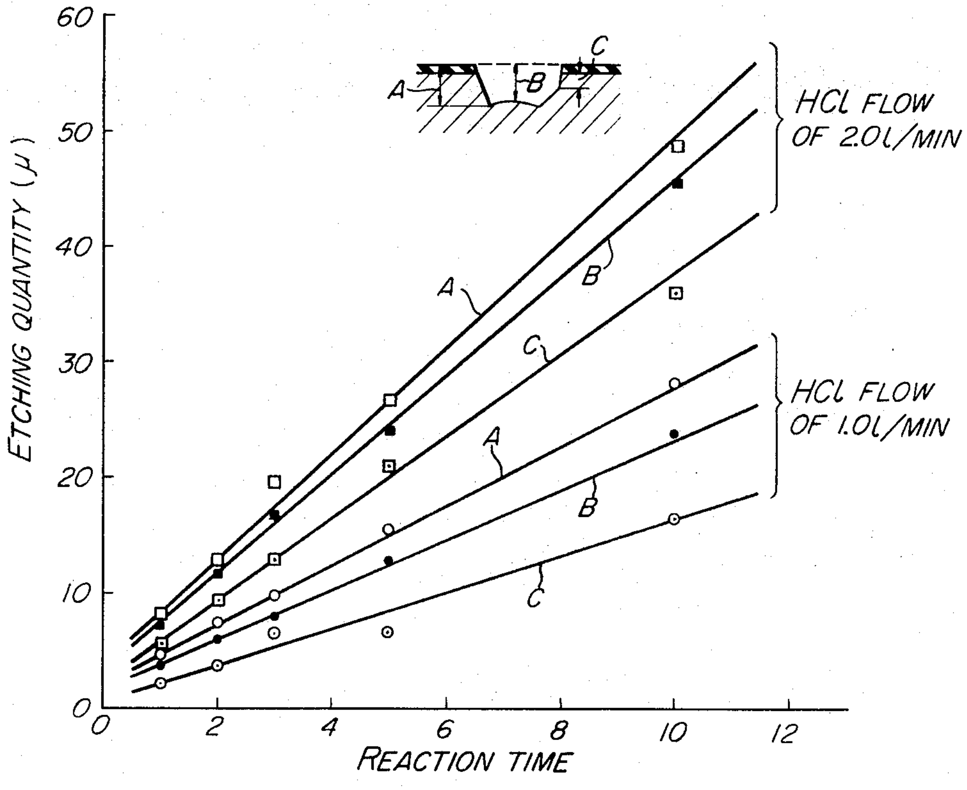
FIG. 9 shows the relation between the etching quantity and the reaction time where the selective vapor phase etching is performed in the [111] plane of the silicon substrate.

(4) Another non-negligible difficulty appears. The hollow formed in the silicon surface portion ([111] plane) exposed by the aperture which is made in the $SiO_2$ film by the vapor phase etching has not a flat bottom but inclined planes as shown in FIG. 7. In such a state the epitaxial layer grows on the inclined planes and causes unevenness on the surface, which is inconvenient for forming an epitaxial semiconductor device in the later treatments. FIG. 9 shows how the silicon substrate exposed in the aperture of $SiO_2$ film is etched at 1150° C. under the condition of an $H_2$ flow of 25 l./min. and an HCl flow of 1.0 or 2.0 l./min. The aperture is provided in the [111] principal surface of the $SiO_2$ film to have a diameter of 600$\mu$. The etching rate increases with the quantity of HCl, but the flatness in the bottom of the hollow is not improved and is always insufficient for forming a semiconductor device.

For such reasons as described above the preferential epitaxial growth and the formation of a circuit component using this epitaxial growth method have remained impractical.

Next, an explanation of this invention solving the above problems will be made with reference to the accompanying drawings followed by the embodiments of this invention.

Figure 10:
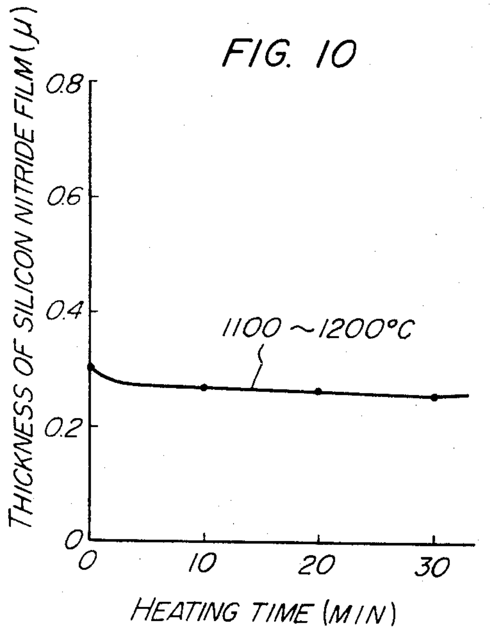
FIG. 10 is an explanatory view of an example of the effect of this invention, i.e. showing the relation between the heating time and the thickness of the silicon nitride layer when the layer is heated in an $H_2$ atmosphere.
Figure 11:
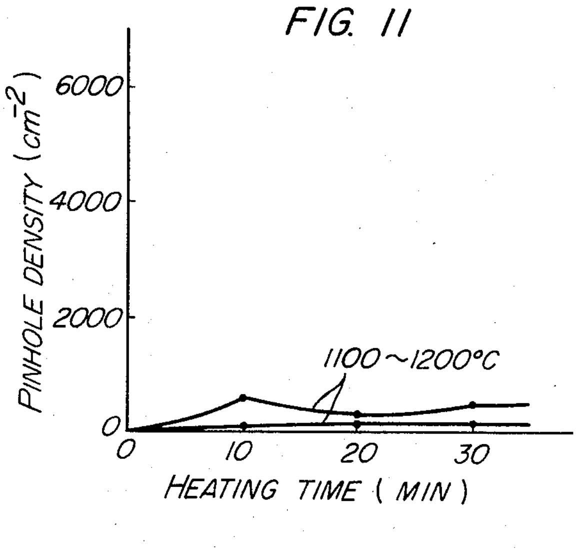
FIG. 11 is an explanatory view of an example of another effect of this invention showing the relation between the heating time and the pinhole density when the silicon nitride layer is heated in an $H_2$ atmosphere.
Figure 12:
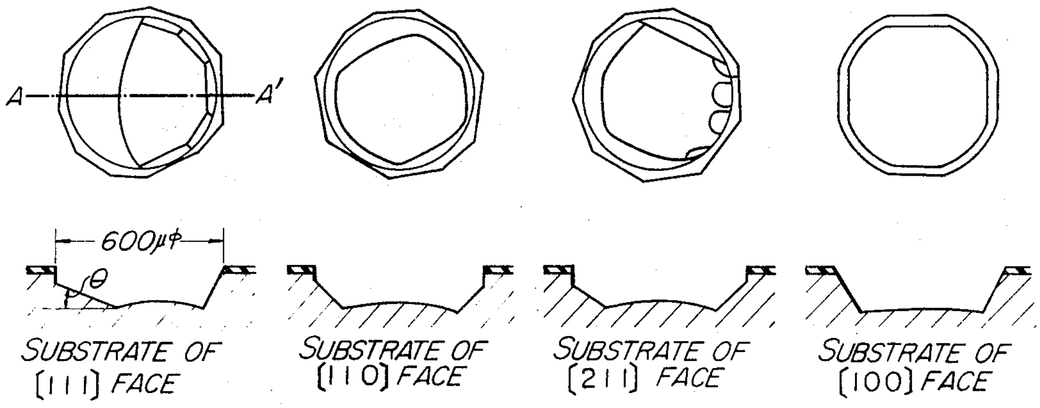
FIG. 12 is an explanatory view of an example of a further effect of this invention showing the etched cross-sections of various crystal surfaces in which hollows are formed by the vapor phase etching.

FIGS. 10 and 11 show the film thickness and the pinhole density of silicon nitride formed in an $H_2$ atmosphere in comparison with those in FIGS. 3 and 4. This silicon nitride film is formed here by heating the silicon substrate at about 1000° C. in the mixed atmosphere of $SiH_4$, $NH_3$ and $H_2$. The conditions of the film test are the same as in the case of $SiO_2$ film. It is seen that the silicon nitride film, in contrast to the $SiO_2$ film, is scarcely etched by the reaction atmosphere. An $Al_2O_3$ (alumina) film is formed on the silicon substrate by the chemical vapor deposition method (CVD method) and the influence of the reaction atmosphere is examined under the same conditions as above. The result shows that the $Al_2O_3$ film decreases its thickness while the pinhole density increases with the heat treatment time similarly to the $SiO_2$ film. $Al_2O_3$ is also known as a protective film for a semiconductor device.

FIGS. 12*a* to 12*d* show the result of etching in the aperture of a silicon nitride film. Here, the aspect of vapor etching in each face of the crystal orientation by the HCl gas is examined. A silicon nitride film having a thickness of about 3000 A. is formed by the CVD method on the surfaces of the silicon substrate with several kinds of crystal orientation. An aperture of 600 $\mu\phi$ is formed by photoetching to expose a portion of the surface of the silicon substrate. The samples are placed in the mixture gas of HCl 1.0 l./min. and $H_2$ 25 l./min. and subjected to a heat treatment of 1150° C. for about 15 minutes. The bottom of the hollow formed by the vapor etching is flat only in the case of the [100] plane. In other faces, the flatness is deteriorated by the appearance of the inclined planes, and the shape of the mask window becomes polygonal. After a further treatment this polygonal phenomenon becomes striking. Therefore, it is desirable to use the [100] plane of the semiconductor for the formation of the refilled epitaxial layer. The window is also transformed from a circular to a polygonal shape in the case of a [100] plane, and finally to a square after further vapor etching. Therefore, if a rectangular aperture is provided in the surface of the silicon nitride film on the [100] plane of the substrate such that the side surfaces are oriented in the [110] direction, no transformation of the aperture portion is seen during the vapor etching process.

Figure 13:
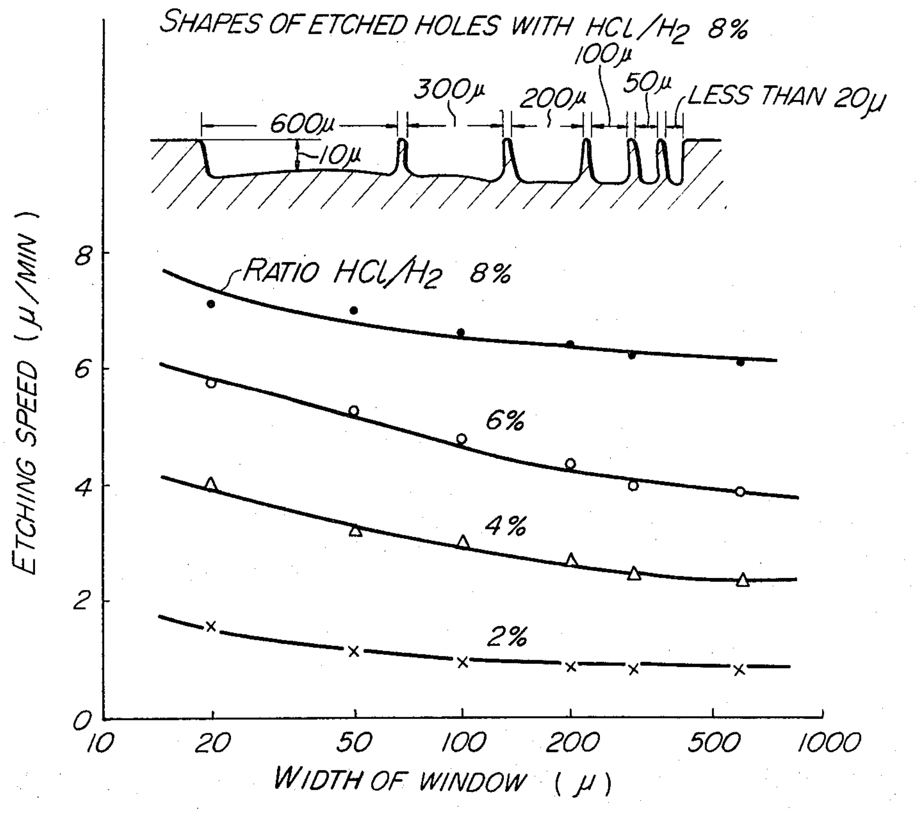
FIG. 13 shows the relation between the etching rate and the etching shape when the silicon substrate is etched from vapor phase after the formation of masking layers having apertures with various sizes on the surface of the silicon substrate.

FIG. 13 shows the relation between the window width and the etching rate of the silicon nitride film as a function of the HCl concentration. As is evident from this figure, the etching rate becomes fast with the increase of HCl concentration. Within the range of the window width between 50 and 200$\mu$ the bottom of the hollow formed by etching is flat, while at less than 50$\mu$ width it becomes convex and above 300$\mu$ the end portion is more etched making the flatness more or less worse. Therefore, in order to flatten the bottom of the hollow the window width should be in the range between 50 and 200$\mu$. For different depths the window width should be changed.

Figure 14:
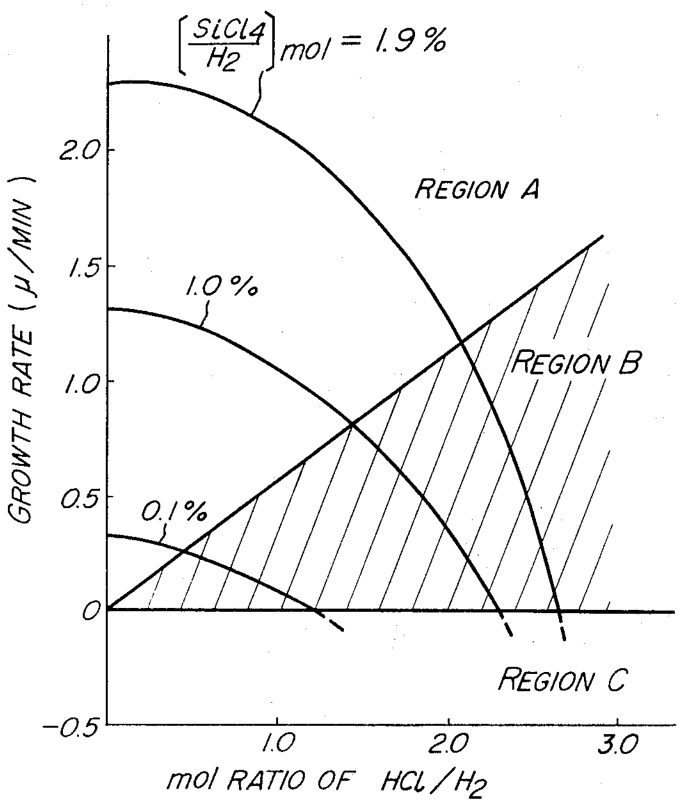
FIG. 14 shows the variation of growth speed of silicon when the silicon substrate is subjected to the heat treatment in an atmosphere of $SiCl_4$, $H_2$ and HCl with mol percent of $HCl/H_2$ as a parameter.

Next, a silicon nitride film having a rectangular aperture of 600 x 100$\mu$ is provided on the [100] surface of the silicon and subject to heat treatment at 1150° C. in the $H_2$ and HCl atmosphere in order to etch the silicon substrate exposed by the aperture portion and form a hollow of about 15$\mu$ deep. Thereafter, a refilled epitaxial layer is formed by the $H_2$ reduction method of $SiCl_4$ in the hollow portion to refill it. In this case, care should be taken to see that silicon polycrystals are not deposited on the silicon nitride film used as a mask by introducing HCl gas in the above reaction atmosphere. When the quantity of HCl gas in increased, neither the deposition of polycrystals on the mask nor the growth of single crystals in the hollow occurs, and etching is promoted. FIG. 14 shows the relation between the growth rate and the quantity of HCl gas. In the region A, a single crystal is grown in the hollow and a silicon polycrystalline layer is deposited on the silicon nitride film. The hatched region B is the ideal region where the epitaxial layer is grown only in the hollow section while no silicon polycrystal is deposited on the silicon nitride film. In the region C with a large concentration of HCl, the crystal deposited by the vapor reaction is etched by HCl so that no vapor growth occurs.

Therefore, it is understood that there is an optimum range of quantity of the mixed HCl in order to form an excellent refilled epitaxial layer. However, this optimum range is difficult to be determined as it depends on the mol ratio of $SiCl_4$ and $H_2$, the reaction temperature, the speed and quantity of flow, etc.

In order to utilize this selectivity grown epitaxial layer for an electric circuit element in integrated circuits, such as transistors, diodes and resistors, a gas of an active impurity capable of giving a conductivity type is mixed into the vapor reaction gas during the growth of the epitaxial layer, or an active impurity is diffused into a desired region of the epitaxial layer after its growth. Thus, a desired PN junction is formed.

This invention forming a semiconductor circuit element for the integrated circuit through the abovementioned processes has the following features.

(A) REGARDING DIODES AND TRANSISTORS ELEMENTS (1) With the silicon nitride film as a mask HCl gas is mixed into the reaction gas so that the epitaxial layer is formed only in the aperture section of the mask. Due to the excellent crystallity of the epitaxial layer a transistor using this layer has good characteristics.

(2) The formation of the epitaxial layer is done in a much shorter time than by the diffusion method so that the element is free from variation of electrical characteristics. Specifically, the absence of an isolation diffusion step which requires a high temperature and substantially a long time eliminates the upward diffusion of impurity from the refilled layer.

(3) Since the transistor element is completely surrounded with a high impurity concentration layer or a collector, as will be described concretely in the later embodiments of this invention, the collector saturation resistance is extremely low and the manufacture of the transistor becomes easy.

(4) The surface area of the semiconductor substrate necessary for the formation of the transistor element is extremely small due to the absence of the conventional isolation diffusion region and the impurity diffusion layer for the channel stopper. Thus, the element is suitable for integration such as IC and LSI.

(5) Especially in the case of transistors, the manufacture is easier than that of the conventional PNP transistors of the triple diffusion, substrate, and lateral types.

(6) Due to the compatibility with the IC process (mainly of NPN) IC and LSI containing superior PNP and NPN transistors can be obtained. Therefore, an IC amplifier of low noise, high gain and a wide band can be obtained.

(7) Since each layer of transistor can be formed by the epitaxial method, the impurity distribution in each layer can be arbitrarily selected by adjusting the quantity of impurity gas contained in the vapor phase growth atmosphere.

(B) REGARDING THE RESISTANCE ELEMENT (1) With the use of a selectively grown epitaxial layer of high resistivity the resistance element can have a high resistance. A resistance of a few hundred KΩ, about ten times as large as the usual value obtained by the impurity diffusion, can be obtained. Thus, the area occupied by the resistance element in the IC and LSI is small.

(2) The manufacturing process of the resistance element has something in common with that of the transistor so that an IC is easily formed through the same processes.

(3) Since the resistance element is completely surrounded with a high impurity concentration layer, excellent thermal radiation and at the same time a high isolation effect can be obtained.

Embodiment 1

This embodiment relates to the growth of a silicon epitaxial layer on a desired surface portion of a silicon single crystal substrate, suited to such a circuit element as a mesa type diode and a mesa type transistor, etc.

It is to be noted here that for the sake of explanation the main portions are drawn enlarged.

Figure 15:
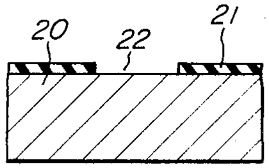
FIGS. 15 and 16 are exemplary view of an embodiment of this invention showing a process for growing the epitaxial layer exclusively on the desired portion of the silicon substrate.

In FIG. 15, 20 is a silicon single crystal substrate which can have either a P or an N conductivity type as occasion demands. Numeral 21 is an $Si_3N_4$ film of 3000 A. thickness provided on the surface of the substrate and having an aperture portion 22. The formation of the silicon nitride film on the surface of the silicon crystal was effected by heating the silicon crystal substrate at 800 to 1000° C. in the mixture atmosphere of $SiH_4$ and $NH_3$. However, the formation is not limited to this method, and other known methods are available.

Figure 16:
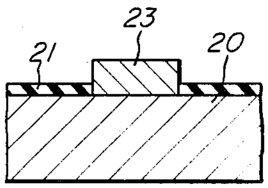
Figure 17:
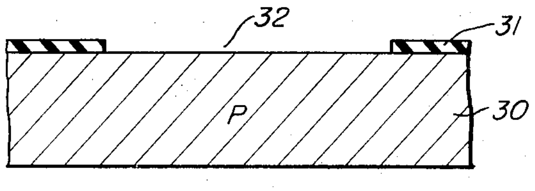
FIGS. 17 to 23 are explanatory views of another embodiment of this invention showing the process of forming an NPN transistor.
Figure 18:
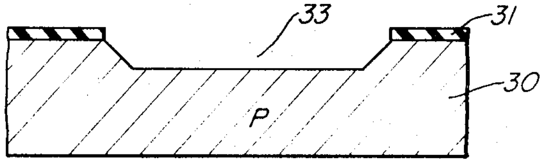
Figure 19:
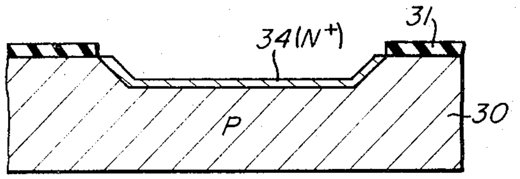

FIG. 16 shows a silicon vapor phase growth layer 23 grown on the exposed surface portion of the silicon crystal substrate. The growth of this layer 23 was done at 1200° C. at $SiCl_4/H_2$ mol ratio of 0.016 with the addition of HCl ($HCl/H_2$ mol ratio of 0.02). The growth layer had a thickness of about 10$\mu$ and the reaction time was 5 minutes. During the growth period no decrease in the thickness of the silicon nitride film 21 or any increase in the aperture diameter was seen.

However, when an $SiO_2$ film was used instead of the silicon nitride film 21 under the same conditions to obtain a silicon growth layer having the same thickness as above, the thickness of the $SiO_2$ film decreased from the initial 7200 A. to 3700 A. The pinhole density of the $SiO_2$ film showed an increasing tendency. The pinhole density right after the deposition of $SiO_2$ film on the surface of the silicon substrate was about $10^2$ cm.$^{-2}$ while that after the formation of the vapor phase growth layer was $5.5\times10^3$ cm.$^{-2}$. The pinhole density increased with the increase of temperature and reaction time. The vapor phase growth of silicon polycrystal took place through these pinholes and many projections of polycrystal growth layer appeared on the surface of the $SiO_2$ film.

In order to give P or N conductivity type to the epitaxial layer grown from the vapor phase, chemical compounds of acceptors or donors were added to the mixture gas of $SiCl_4$, $H_2$ and HCl; i.e. $BCl_3$ and $BH_3$ for P type and $PCl_3$, $PH_3$ and $AsH_3$ for the N type.

Embodiment 2

This embodiment relates to the formation of a refilled epitaxial layer in the desired surface portion of the semiconductor substrate and the formation of an NPN transistor in this refilled layer.

FIGS. 17 to 23 show the processes of forming an NPN transistor using the inventive refilled epitaxial method. For the sake of explanation the main portions are drawn enlarged.

In these figures, 30 is a P type silicon substrate whose principal surface is the [100] plane. An $Si_3N_4$ film 31 of 3000 A. thickness was formed by the reaction of $SiH_4$ and $NH_3$ at 1000° C. on the principal surface. An aperture 32 was formed by the photoresist process in the prescribed portion of the $Si_3N_4$ film, where the surface of the silicon substrate was exposed. Next, the silicon substrate 30 was disposed in a reaction apparatus (not shown) and the exposed surface was etched in the vapor phase to form a hollow 33. The etching was done keeping the silicon substrate at 1150° C. to 1270° C. in the mixture gas of $H_2$ and HCl. Thereafter, a small quantity of $AsH_3$ and HCl was mixed into the conventional epitaxial growth gas ($H_2$+$SiCl_4$) to form an $N^+$ epitaxial layer 34. The $AsH_3$ gas determines the conductivity type of the epitaxial layer. So, the resistivity of epitaxial layer can be controlled by the mixing amount of $AsH_3$. The mixing of HCl gas is to prevent a polycrystalline layer growing on the $Si_3N_4$ film.

Figure 20:
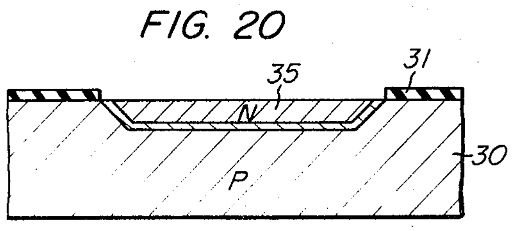

After the $N^+$ layer 34 having the prescribed thickness was formed, the quantity of the mixed $AsH_3$ was decreased until the N type refilled epitaxial layer grew to the same level as the surface of the substrate (FIG. 20).

Figure 21:
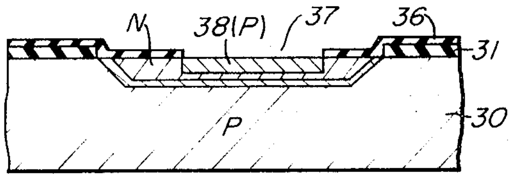
Figure 22:
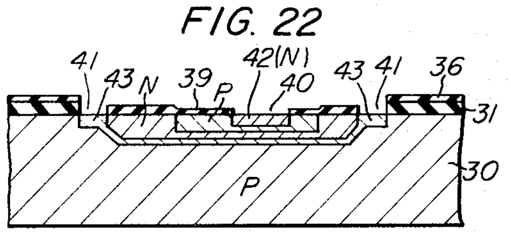

Next, a new $SiO_2$ film 36 was deposited (FIG. 21). A hole 37 was perforated by photoetching. A P type impurity was diffused through this hole to form a P type diffusion layer 38 (base layer). Aperture portions 40 and 41 were perforated by photoetching in the $SiO_2$ film 39 formed on the P type diffusion layer and on the $N^+$ type epitaxial layer during the formation of the P type diffusion layer. An N type impurity was diffused through the aperture portions 40 and 41 to form N type diffusion layers 42 and 43, 42 being the emitter layer and 43 the lead-out portion for the collector electrode. Through the above processes utilizing the refilled epitaxial method the structure of an NPN junction transistor element was obtained. Holes for each electrode were perforated by photoetching and an electrode material such as Al was deposited.

Figure 23:
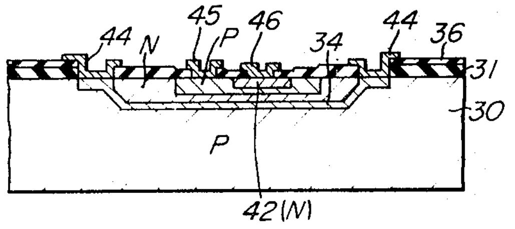

FIG. 23 shows a transistor thus obtained. Since the collector region is completely surrounded with the $N^+$ layer 34, the transistor has a low collector saturation resistance and good frequency characteristics. Due to the small area occupied in the surface of the semiconductor substrate and due to the planar type the transistor is most suited to the circuit element for IC and LSI, etc. Further, according to this invention, the $Si_3N_4$ film used as a mask during the process of forming the refilled epitaxial layer is proof against etching. The bottom of the hollow formed by etching is flat. Since the principal surface of the semiconductor substrate is the [100] plane, a uniform base width is obtained. Therefore, the design of the transistor is extremely easy and the characteristics are approximately equal to the theoretical ones.

Although in this embodiment an $SiO_2$ film was coated on the $Si_3N_4$ film after the formation of the refilled epitaxial layer, it is possible to replace the $Si_3N_4$ film by a new $SiO_2$ film and selectively diffuse an impurity with the $SiO_2$ film as a mask layer. In order to remove the $Si_3N_4$ film from the surface of silicon substrate phosphoric acid or fluoric acid can be utilized.

Since the NPN transistor is completely surrounded with the high impurity concentration layer as will be the case in the following embodiments, the heat radiation effect of the circuit element can be further promoted by fitting heat-sink materials or electrodes to this high impurity concentration layer.

Embodiment 3

Figure 25:
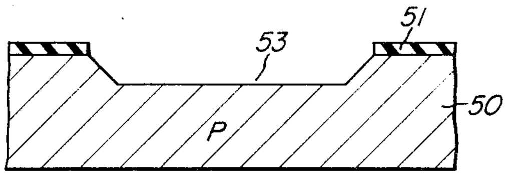
Figure 26:
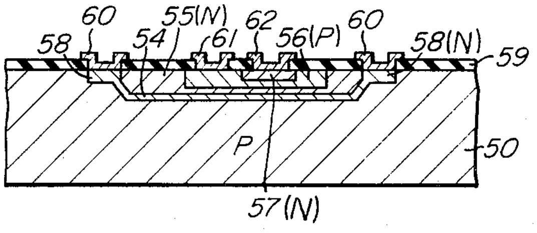
Figure 27:
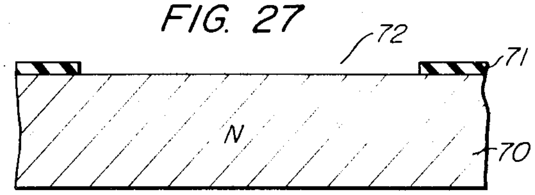
FIGS. 27 to 34 are explanatory views of still another embodiment of this invention showing the processes of forming another NPN transistor.
Figure 28:
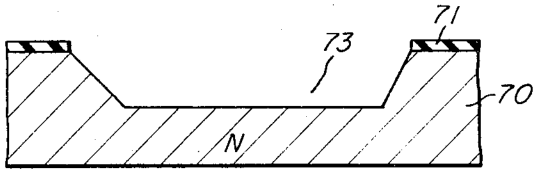

Another embodiment of this invention will be explained with reference to FIGS. 24 to 26.

Figure 24:
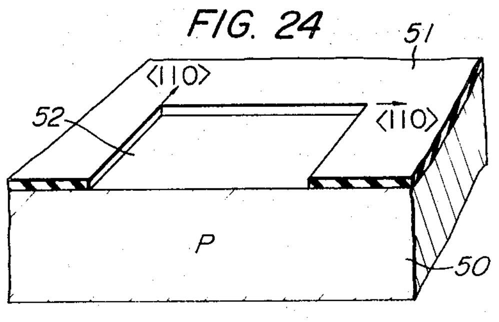
FIGS. 24 to 26 are explanatory views of a further embodiment of this invention showing the processes of forming another NPN transistor.

FIG. 24 shows the state in which an $SiN_4$ film 51 is coated on the surface of P type silicon substrate 50 having the [100] plane as the principal surface, and a rectangular aperture 52 with its sides oriented in the direction of [110] axis is provided on a described portion of the film 51.

Through the same processes as in the foregoing embodiments a hole 53 was formed (FIG. 25), in which an $N^+$ layer 54 and an N layer 55 were epitaxially grown. A P type diffusion layer 56 and N type diffusion layers 57 and 58 were formed in the N type epitaxial layer 55 by the selective diffusion of the impurity. After the formation of the structure of an NPN transistor element the $SiO_2$ film and the $Si_3N_4$ film used as mask layers were entirely removed. Thereafter, the surface of the refilled epitaxial layer was lightly etched (by about $1\mu$) by solution or vapor etching. A new $SiO_2$ film 59 was coated on the clean surface by the thermal decomposition of silane. Prescribed positions of this new $SiO_2$ film were perforated. The collector, base and emitter electrodes 60, 61 and 62 were formed by Al evaporation.

In this embodiment since the passivation film on the surface of the semiconductor substrate is extremely genuine containing no impurity, the electrical characteristics of the NPN transistor is very stable. Noises due to the surface defect layer are small.

Embodiment 4

A further embodiment of this invention will be explained with reference to FIGS. 27 to 34. This embodiment relates to the processes of forming an NPN transistor isolated in an N type silicon substrate. The requirement of the formation of the isolation NPN transistor in an N type semiconductor layer is very large in the field of IC and LSI. Therefore, the embodiment meets this requirement.

Figure 29:
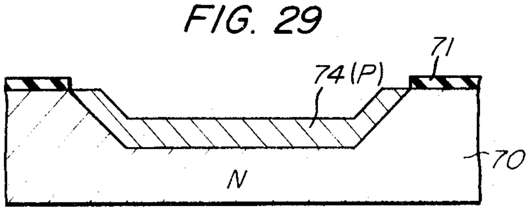
Figure 30:
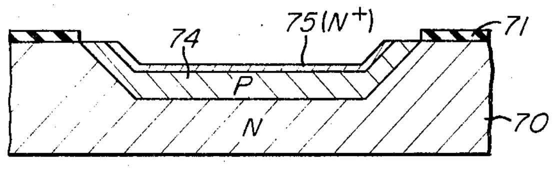
Figure 31:
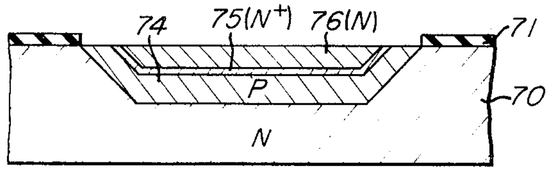
Figure 32:
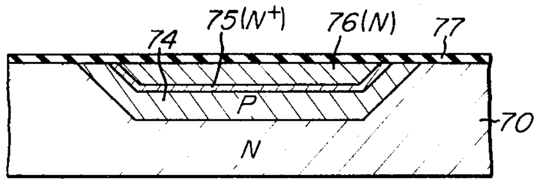

In FIGS. 27 to 34, 70 is an N type silicon substrate whose principal surface is the [100] plane. An $Si_3N_4$ film 71 was provided on the surface of the substrate. An aperture 72 was perforated in a prescribed position of the $Si_3N_4$ film. Thereafter, the exposed silicon substrate was vapor-etched to form a hollow 73 in a furnace (not shown) in the presence of mixture gas of HCl and $H_2$. Next, the reaction gas was changed to the mixture gas of $SiCl_4$, $H_2$, HCl and $BCl_3$ to form a thin P type epitaxial layer 74 in the hollow 73 (FIG. 29). The thickness of the epitaxial layer 74 was a function of the reaction time, the temperature, the composition of the reaction gas and the flow rate, etc. A desired thin P type epitaxial layer could be formed by suitably adjusting these parameters. Next, an $N^+$ type layer 75 was epitaxially grown on the P type layer 74 (FIG. 30) such that the N type epitaxial layer 76 grew to the surface level of the silicon substrate (FIG. 31). After the growth of this layer the $Si_3N_4$ film 71 used as a mask layer was completely removed by phosphoric acid and a new $SiO_2$ film 77 was formed (FIG. 32). The formation of this $SiO_2$ film may be done by high temperature oxidation or thermal decomposition of silane or other publicly known methods.

Figure 33:
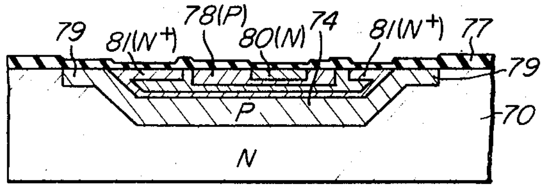

Subsequently P type diffusion layers 78 and 79 and N type diffusion layers 80 and 81 were formed in the refilled epitaxial layer by the selective diffusion method of an impurity with the $SiO_2$ film 77 as a mask layer (FIG. 33). The steps formed on the $SiO_2$ film 77 are caused by the thinly formed $SiO_2$ film in the aperture portion during the impurity diffusion.

Numeral 79 is a P type diffusion layer provided on the surface portion of the substrate simultaneously with the formation of base layer, and serves to prevent an N channel caused by the $SiO_2$ film 77. Without this P type diffusion layer 79 the collector of the NPN transistor would be electrically short-circuited to the substrate by the N channel formed by the $SiO_2$ film 77. Numeral 81 is a diffusion layer of an N type impurity serving as the lead-out portion for the collector.

Figure 34:
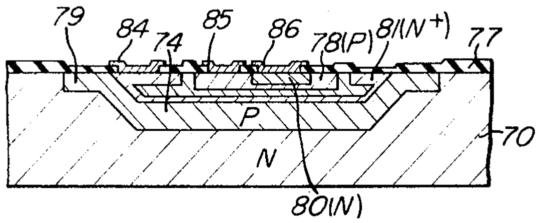

The $SiO_2$ film 77 was then perforated by photo-etching. The collector electrode 84, the base electrode 85 and the emitter electrode 86 were formed by Al perforation (FIG. 34).

Through the above processes an NPN transistor isolated from the substrate was formed in the surface of the N type silicon substrate.

Although in the foregoing embodiments 2 to 4 the base and emitter layers were formed by diffusing an impurity, the refilled epitaxial layer may be utilized for their formation as well as for the collector layer.

Embodiment 5

FIGS. 35 to 42 are longitudinal sectional views showing the processes of forming a PNP transistor in the surface of an N type silicon substrate by the refilled epitaxial method. For the sake of explanation the main portions are drawn enlarged.

Figure 36:
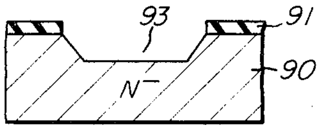
FIGS. 35 to 42 are explanatory views of another embodiment of this invention showing a PNP transistor.
Figure 37:
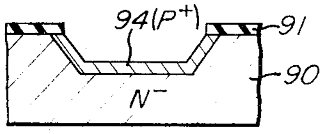
Figure 38:
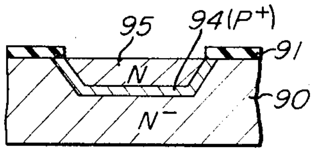
Figure 35:
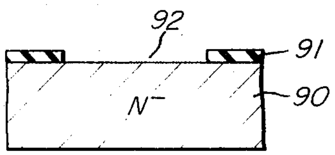
Figure 41:
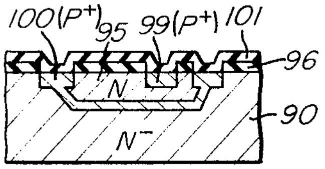

Numeral 90 is an N type silicon substrate with a resistivity of 10Ω m. whose principal surface in the [100] plane, on which an $Si_3N_4$ film 91 was provided. The formation of this $Si_3N_4$ film was done in the mixture gas of $SiH_4$ and $NH_3$ at 800 to 1000° C., but other methods such as the sputtering method may be applied. After the formation of the $Si_3N_4$ film with a desired thickness (about 3000 A.) a portion of the film was perforated by photo-etching to form an aperture 92 (FIG. 35). Thereafter, the silicon substrate was subjected to the mixture gas of $H_2$ and HCl to etch in the vapor phase a portion of the silicon substrate exposed by the aperture 92 whereby a desired hollow 93 was formed (FIG. 36). A P type impurity i.e. boron was diffused into the surface of the hollow thereby to form a $P^+$ layer (collector layer) 94 of high impurity concentration (FIG. 37). The formation of this $P^+$ layer may be done by the epitaxial method. Next by the refilled epitaxial method an N type epitaxial layer 95 was grown to the surface level of the semiconductor substrate (FIG. 38). The manufacturing method of this refilled epitaxial layer was carried out by the $H_2$ reduction method of $SiCl_4$. By mixing a prescribed quantity of $AsH_3$ gas in the mixture gas of $SiCl_4$ and $H_2$ the conductivity of the epitaxial layer becomes N type, the value of resistivity being arbitrarily adjusted by the $AsH_3$ flow rate. Although it is possible to form the epitaxial growth layer in the hollow by accurately controlling the quantity of $SiCl_4$ and H, the flow rate and reaction temperature, usually a silicon polycrystalline layer (amorphous material) is deposited on the $Si_3N_4$ film as well as in the hollow portion.

Therefore, in the embodiment the epitaxial growth was performed by mixing a prescribed quantity of HCl vapor into the mixture gas of $SiCl_4$, $H_2$ and $AsH_3$. By this method the epitaxial layer was grown only in the hollow 93.

Figure 39:
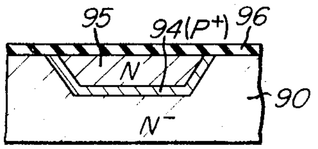
Figure 40:
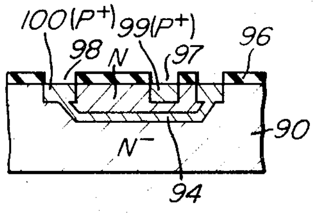

After the formation of the N type refilled epitaxial layer (base layer) 95 the $Si_3N_4$ film on the surface of substrate was removed by phosphoric acid and a new $SiO_2$ film 96 was coated by the thermal decomposition of silane or by other methods (FIG. 39). Alternatively, the $SiO_2$ film may be coated subsequently after the refilled epitaxial growth in the same reaction apparatus. Next the $SiO_2$ film was perforated by photoetching to form aperture portions 97 and 98, through which a P type impurity such as boron was diffused to form $P^+$ layers 99 and 100 (FIG. 40). The $P^+$ layer 99 became the emitter of the PNP transistor while the $P^+$ layer 100 the electrode lead-out portion for the collector. After the formation of the emitter region a new $SiO_2$ film 101 (FIG. 41) was coated on the aperture portions 97 and 98 to seal them, the coating being done by utilizing the $SiO_2$ film formed on the $P^+$ layer 9 and 100 or by the thermal decomposition of silane. A portion of the $SiO_2$ film on the refilled epitaxial layer 95 was removed by photoetching to form an aperture 102, through which an N type impurity such as phosphor was diffused to form an $N^+$ layer. This $N^+$ layer became the electrode portion for the base layer 95.

Through the above processes the structure of a PNP transistor was obtained. The $SiO_2$ film was perforated by photoetching to make holes. By forming the collector, base and emitter electrodes in these holes a PNP transistor was obtained.

Embodiment 6

Figure 43:
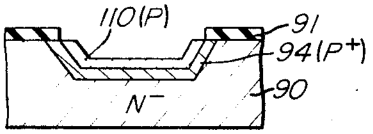
FIGS. 43 and 44 are explanatory views of another embodiment of this invention showing the processes of forming another PNP transistor.
Figure 44:
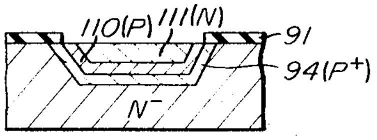

FIGS. 43 and 44 show a case with an additional step added to the manufacturing steps of a PNP transistor shown in Embodiment 5.

After the formation of the $P^+$ layer 94 in FIG. 37, a P type layer 110 with a low impurity concentration shown in FIG. 43 was formed by vapor growth followed by the formation of an N type refilled epitaxial layer 111 on the P type layer 110. The subsequent steps for forming the PNP transistor is the same as shown in FIGS. 39 to 42 in Embodiment 5.

In this embodiment due to the high resistivity of the $P^-$ layer provided between the collector and base layers the PNP transistor has a high breakdown voltage.

It is possible here to grow the $P^-$ epitaxial layer on the $P^+$ layer 94 to refill the hollow completely and form diffusion layers of N (base layer) and P type (emitter layer) in the $P^-$ type refilled epitaxial layer.

Embodiment 7

Figure 47:
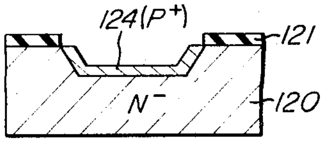
FIGS. 45 to 50 show another embodiment of this invention forming another PNP transistor.
Figure 42:
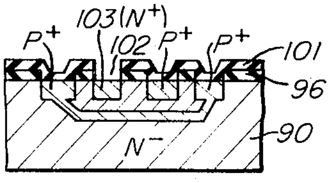
Figure 48:
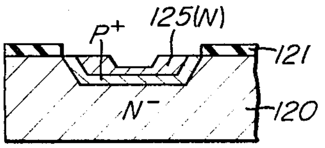
Figure 49:
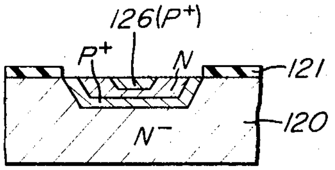

FIGS. 45 to 50 show an embodiment where the collector, base and emitter layers are formed by the refilled epitaxial method. Numeral 120 is a high resistivity silicon substrate whose principal surface is the [100] plane. Numeral 121 is an $Si_3N_4$ film formed on the surface of the silicon substrate. An aperture 122 was provided in one portion of the $Si_3N_4$ film. A hollow 123 (FIG. 46) was formed in a portion of the silicon substrate exposed by the aperture by subjecting the substrate to the vapor of $H_2$ and HCl. Thereafter, a $P^+$ layer (collector) 124 of high impurity concentration extending to the surface of the substrate was epitaxially grown in the surface of the hollow (FIG. 47). In this case either $B_2H_6$ gas or $BCl_3$ vapor was mixed into the mixture gas of $SiCl_4$ and $H_2$. After the formation of the $P^+$ layer 124 with a prescribed thickness the $B_2H_6$ gas was stopped and replaced by $AsH_3$ gas, whereby an N type layer (base) 125 was formed in the hollow (FIG. 48). After the formation of the N type layer with a prescribed thickness the $AsH_3$ gas was replaced by $B_2H_6$ gas to form a $P^+$ layer (emitter) 126 (FIG. 49). Here, it is necessary that the surface of this $P^+$ layer is in the same level as the surface of the substrate.

Figure 50:
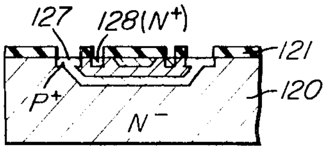
Figure 45:
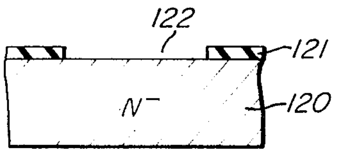

Through the above processes the structure of the PNP transistor was obtained. In order to provide an electrode in each region the $P^+$ layer 127 and the $N^+$ layer 128 was formed by the selective diffusion of impurities as shown in FIG. 50.

The electrical characteristics of the PNP transistors obtained in the above three embodiments were $h_{FE}$ of 10 to 50 and $f_a$ of 20 to 100 mHz.

Embodiment 8

Figure 51:
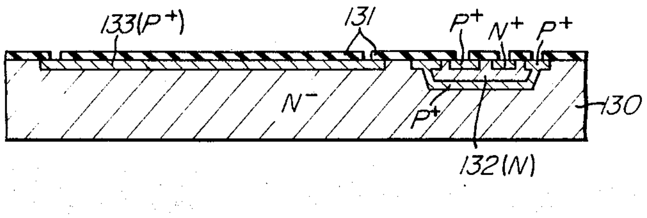
FIG. 51 is a longitudinal sectional view showing the combination of a PNP transistor and a diffused resistance element according to another embodiment of this invention.
Figure 46:
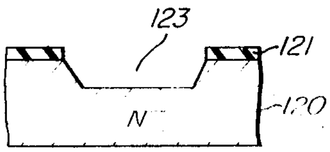

As shown in FIG. 51, a desired portion of an $N^-$ type silicon semiconductor substrate 130 was selectively etched to form a hollow, in which a PNP transistor element 132 was formed by the refilled epitaxial method. Concurrently with the formation of the $P^+$ type emitter diffusion a $P^+$ type resistor element 133 was formed by the selective diffusion in another portion of the substrate 130. FIG. 51 shows the state where holes for wiring were perforated in the final insulating film 131. The wiring between the elements are omitted here.

Embodiment 9

Figure 52:
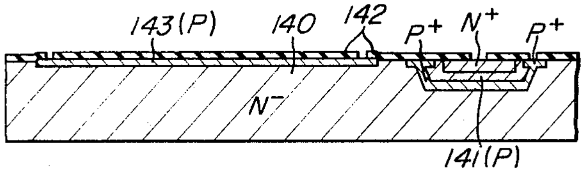
FIG. 52 is a longitudinal sectional view showing the combination of a NPN transistor and a diffused resistance element according to another embodiment of this invention.

As shown in FIG. 52, a desired portion of the $N^-$ type silicon semiconductor substrate 140 was selectively etched to form a hollow, in which a diode 141 was formed by the refilled epitaxial method. The passivation film e.g. the $SiO_2$ film on another desired portion of the substrate 140 was perforated to provide an aperture (not shown). A P type layer was epitaxially grown selectively to form a resistance element 143, on which an insulating film was formed. It is preferable to lightly etch in vapor phase the surface portion of the substrate in the aperture just before this P type epitaxial growth. FIG. 52 shows the state when the insulating film is perforated in advance of the mutual wiring up of the elements.

Embodiment 10

Figure 53:
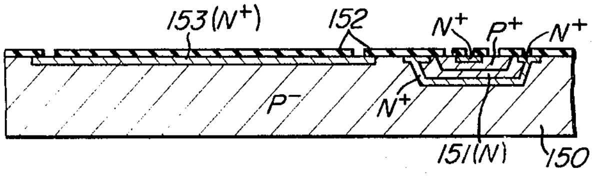
FIG. 53 is a longitudinal sectional view showing the combination of an NPN transistor and a resistance element using an epitaxial layer according to another embodiment of this invention.

As shown in FIG. 53, an NPN transistor element 151 was formed in a desired portion of a $P^-$ type silicon semiconductor substrate 150 using the refilled epitaxial method. Concurrently with the $N^+$ type diffusion of emitter and $N^+$ type resistance element 153 was formed by the selective diffusion in another desired portion of the substrate 150. FIG. 53 shows the state where the surface of the insulating film is perforated. The electrical connections between the elements are omitted here.

Although the above embodiments relate to the constitution of IC by combining PNP transistors, diodes, NPN transistors and resistance elements, it is possible to constitute IC and LSI by the combination of resistance elements with complementary integrated circuits including PNP and NPN transistors and diodes.

Embodiment 11

Figure 54:
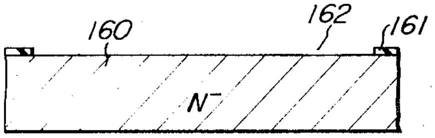
FIGS. 54 to 57 show the processes of forming a resistance element according to another embodiment of this invention.
Figure 55:
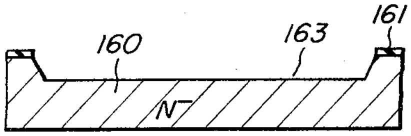
Figure 56:
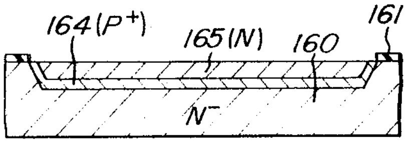
Figure 57:
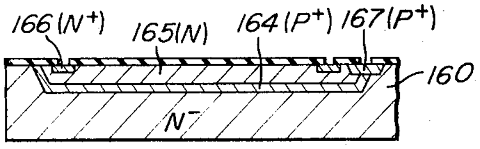

As shown in FIG. 54, after an $Si_3N_4$ masking layer was coated on the surface of an N type silicon substrate 160 of low impurity concentration with a resistivity of 1 to 10Ω cm., an aperture with a desired size was perforated by the usual photoetching method. Next as shown in FIG. 55, the exposed silicon in the aperture 162 was subjected to the selective vapor etching at about 1200° C. in the mixture gas of $H_2$ and HCl gas. Alternatively a hollow 163 of a few $\mu$ depth was provided by the chemical etching method. As shown in FIG. 56, a $P^+$ type region 164 of high impurity concentration was formed in the hollow 163 by the refilled epitaxial growth method as well as by the diffusion method. An N type epitaxial layer 165 was grown on the surface of this $P^+$ type region 164 to the same level as the surface of substrate. As shown in FIG. 57, after the $SiO_2$ film was coated on the surface of the N type epitaxial layer 165, regions 166 and 167 were formed by using the conventional photoengraving and selective diffusion methods, obtaining a high resistance element. In FIG. 57, the N type epitaxial layer 165 becomes the resistance element while the P type epitaxial layer performs an isolating action. The deposition of the $SiO_2$ film in FIG. 57 was done continuously in the same apparatus after the epitaxial growth, or carried out separately. In the latter case, after the removal of the $Si_3N_4$ film an $SiO_2$ film was newly coated.

Embodiment 12

Figure 58:
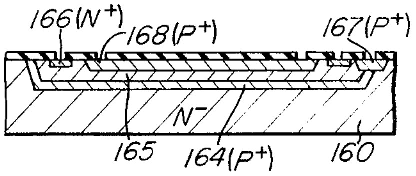
FIGS. 58 and 59 show longitudinal sectional views of each resistance circuit element according to another embodiment of this invention.

A $P^+$ type region 164 and an N type epitaxial layer 165 were grown in a hollow provided in an $N^-$ type silicon substrate 160 in the same manner as in the foregoing embodiment. Next as shown in FIG. 58, after an $SiO_2$ film was deposited on the surface of the N type epitaxial layer 165, a $P^+$ type diffusion layer 168 and $N^+$ and $P^+$ type electrode lead-out portions 166 and 167 were provided by the photoetching and selective diffusion methods, obtaining a resistance element.

Embodiment 13

Figure 59:
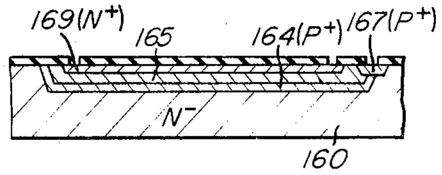

As shown in FIG. 59, after a $P^+$ type region 164 was formed by the refilled epitaxial growth method or by the diffusion method in a hollow provided in an $N^-$ type substrate 160, a P type epitaxial layer 165 was formed on the surface of this region 164 to the same level as the surface of the substrate. Next an $N^+$ type region 169 and a $P^+$ type region for contacting wires were formed by the selective diffusion method on the surface of the $P^+$ type epitaxial layer 165, thereby forming a resistance element.

Embodiment 14

Figure 60:
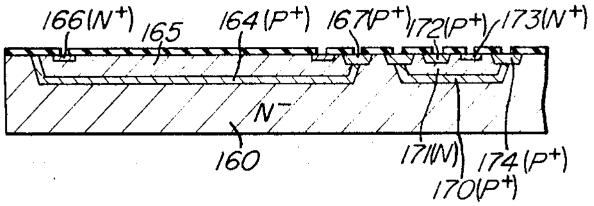
FIGS. 60 to 62 are explanatory views of a further embodiment of this invention showing longitudinal sectional views of circuit elements made of the combination of a resistance element and a transistor.

FIG. 60 shows an IC formed by combining a resistance element shown in FIG. 57 and a PNP transistor. In this embodiment, when the resistance element was formed, selective etching and refilled epitaxial growth were done simultaneously in a region where the transistor was to be formed, forming a $P^+$ type region 170 and an N type epitaxial layer 171. At the same time a PNP transistor consisting of the $P^+$ emitter 172, the $N^+$ base 173 and the $P^+$ type collector was formed by the selective diffusion, thereby obtaining an IC.

Embodiment 15

Figure 61:
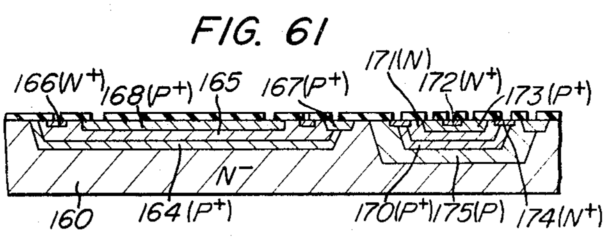

FIG. 61 shows an IC formed by combining the resistance element in FIG. 58 and an NPN transistor. In this embodiment, after a P type region 175 was formed by the selective etching and the refilled epitaxial growth method in a region where the NPN transistor was to be formed, selective etching, refilled epitaxial growth and selective diffusion were performed simultaneously with the formation of the resistance element, thereby forming an NPN transistor consisting of the P type region 170, the N type epitaxial layer 171, the $N^+$ type emitter 172, the $P^+$ base 173 and the $N^+$ type collector 174. Thus, an IC was fabricated.

Embodiment 16

Figure 62:
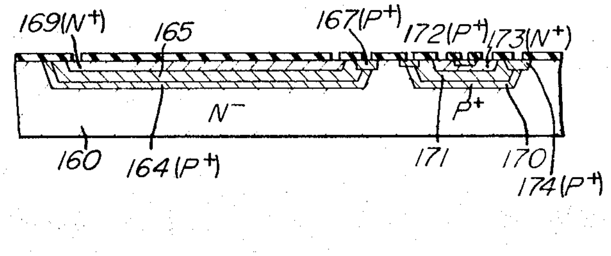

FIG. 62 shows an IC formed by combining the resistance element shown in FIG. 59 and a PNP transistor. The IC was fabricated in the same manner as those in FIGS. 60 and 61.

Embodiment 17

FIGS. 63 to 67 show the manufacturing processes for forming PNP and NPN transistors in an epitaxial layer or the surface of a silicon substrate using the refilled epitaxial method.

Figure 63:
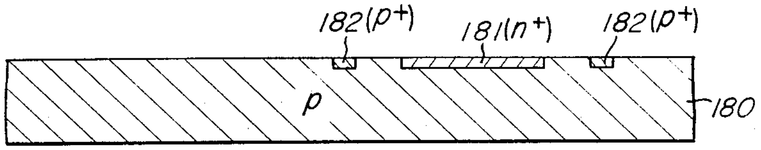
FIGS. 63 to 72 are an explanatory view of still another embodiment of this invention, showing the longitudinal sectional views of fabrication processes of a complementary IC.
Figure 64:
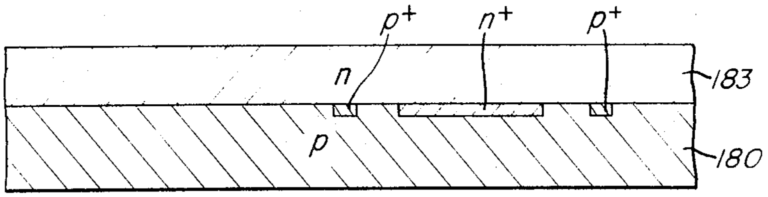
Figure 65:
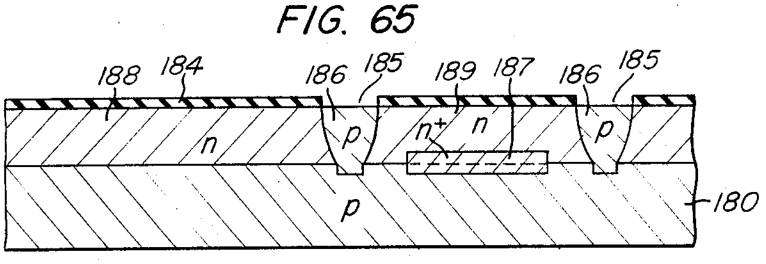
Figure 66:
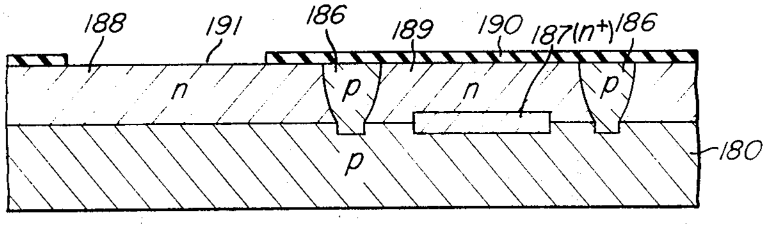
Figure 67:
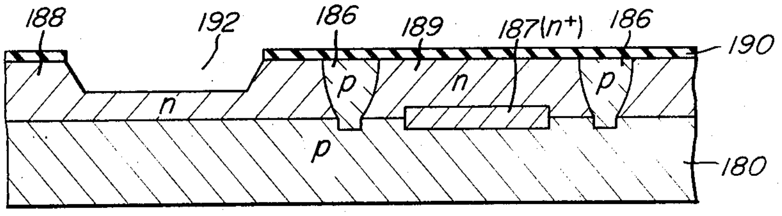

For the sake of explanation the main portions are drawn enlarged. Only a pair of NPN and PNP transistors are shown. Actually, many transistors, diodes and resistance elements are uniformly performed on a sheet of semiconductor substrate. In FIG. 63, 180 indicates a P type silicon substrate with a resistivity of about 10Ω cm., on which an N type high impurity concentration layer 181 and a P type high impurity concentration layer 182 were provided by the selective diffusion method of impurities. The high impurity concentration layer 181 served to decrease the resistance value of the collector layer of the transistor later formed on the surface thereof. The layer 181 is usually called a refilled layer or a buried layer. Next an N type epitaxial layer 183 of about 7$\mu$ thickness was formed on the surface of the silicon substrate by the $H_2$ reduction of silicon chloride. An $SiO_2$ film 184 was formed on the surface of the epitaxial layer. Aperture portions 185 having a desired shape were formed by photoresist process. Thereafter, a P type impurity was diffused through the N type epitaxial layer in the aperture portions, to form P type diffusion layers 186 as shown in FIG. 65. These diffusion layers 186 served to divide the N type epitaxial layer 183 into a first region 188 and a second region 189. The layers 186 are called isolation diffusion layers. The formation of these isolation layers required a high temperature and long time so that the impurity in the buried layer 181 was also diffused into the epitaxial layer, as shown by 187 in FIG. 65.

Next the $SiO_2$ film 184 used as a mask layer for the isolation diffusion was completely removed from the epitaxial layer and an $Si_3N_4$ film 190 was newly coated thereon. The coating of the $Si_3N_4$ film was done by a publicly known method. An aperture 191 having an arbitrary shape was formed in a desired section of the $Si_3N_4$ film on the first region 188 of the epitaxial layer by the photoresist process. Thereafter, the silicon substrate was subjected to the mixture gas of HCl and $H_2$. The epitaxial layer exposed by the aperture of the $Si_3N_4$ film was vapor etched, forming a hollow 192.

Figure 68:
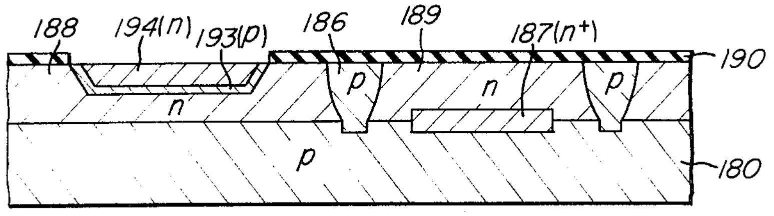
Figure 69:
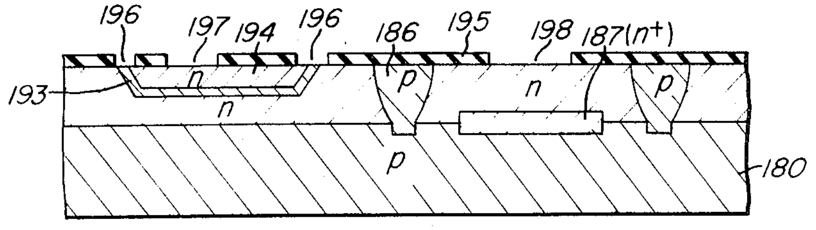
Figure 70:
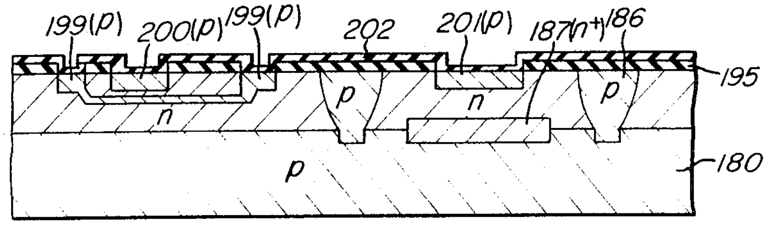
Figure 71:
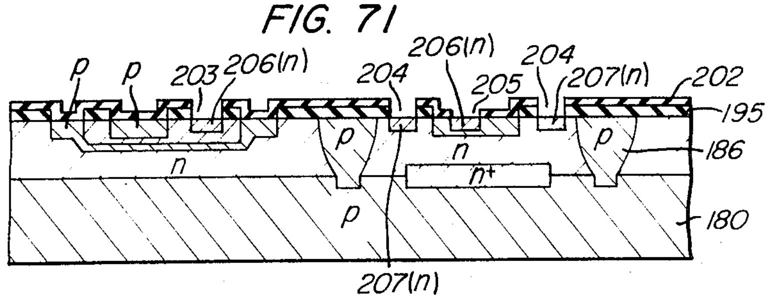

After the formation of the hollow 192 having a prescribed depth the atmosphere was changed to the mixture gas of $SiCl_4$, $H_2$ and $B_2H_6$. By keeping the temperature of the substrate at about 1150° C. a P type epitaxial layer 193 was formed on the surface portion of the hollow. The resistivity of the P type epitaxial layer could be controlled by the mixing quantity of $B_2H_6$ gas for the P type impurity. After the epitaxial layer having a prescribed thickness was formed, the $B_2H_6$ gas was changed to the $AsH_3$ gas thereby to form an N type refilled epitaxial layer 194, which is grown to the surface level of the epitaxial layer 183 (FIG. 68). The resistivity of the epitaxial layer 194 is controlled by the mixed quantity of $AsH_3$ gas.

After the desired refilled epitaxial layer was formed, the $Si_3N_4$ film 190 used as a mask layer was completely removed by phosphoric acid solution, and an $SiO_2$ film 195 was newly formed by the thermal decomposition of silane. Apertures 196, 197 and 198 having a prescribed shape were perforated. A P type impurity was selectively diffused through these apertures to form P type impurity diffusion layers 199, 200 and 201. In order to form these diffusion layers in an oxidizing atmosphere a thin $SiO_2$ film 202 was formed on the epitaxial layer. Next, using the photoetching method apertures 203, 204 and 205 were perforated in the $SiO_2$ film. An N type impurity was diffused through these apertures to form N type diffusion layers 206 and 207. Through the above processes the structure of NPN and PNP transistors were formed in the epitaxial layer 183. Prescribed portions of the $SiO_2$ film were perforated to form the electrodes for each transistor by the evaporation of Al. In FIG. 72, 208, 209 and 210 are the collector, base and emitter electrodes of the PNP transistor and 211, 212 and 213 are those of the NPN transistor.

Figure 72:
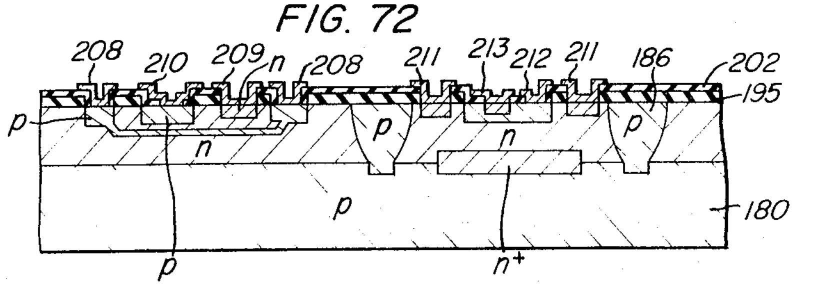

The complementary transistor shown in FIG. 72 has excellent electrical characteristics since the PNP transistor is formed in the refilled epitaxial layer. Since the collector and base layers are made by utilizing the epitaxial layer, the fabrication can be made easily in a short time.

In the above embodiment although the collector layer of the PNP transistor is formed by using a P type epitaxial layer, it is possible to form a transistor with a collector of a $P^+$–P double structure by forming preliminarily a P type high impurity concentration layer on the surface of the hollow by the impurity diffusion method or the epitaxial method and thereafter forming a P type refilled epitaxial layer in this P+ layer. In this case, this P+ layer serves not only to decrease the collector resistance of the PNP transistor but also leads the heat generated in the PNP transistor outwards.

We claim:

1. A method for fabricating a semiconductor component for a semiconductor circuit comprising the steps of:

(a) forming a silicon nitride masking layer with at least one aperture upon one surface of a silicon substrate; and (b) heat-treating said silicon substrate with said silicon nitride mask layer thereon at a temperature of from about 1100° C. to about 1200° C. and in a mixture gas comprising hydrogen, silicon halide whose mol percentage to that of hydrogen is between about 0.1 and 1.9 and hydrogen chloride; whose mol percentage to that of hydrogen is between about 0.5 and 2.8, whereby a silicon epitaxial layer is grown only on the exposed surface of the silicon substrate without susbtantially any growth on said silicon nitride mask; and wherein said silicon nitride mask layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns.

2. A method for fabricating a semiconductor component for a semiconductor circuit according to claim 1, wherein said silicon substrate has one conductivity type and an active impurity gas is further added to the mixture gas of $SiCl_4$, $H_2$ and HCl, said active impurity gas being capable of rendering said silicon epitaxial layer into a second conductivity type opposite to that of said silicon substrate, thereby obtaining a pn junction between said substrate and said silicon epitaxial layer.

3. A method for forming a semiconductor component for a semiconductor circuit comprising the steps of:

(a) forming a silicon nitride masking layer with at least one aperture on one surface portion of a silicon substrate;

(b) vapor etching the exposed surface portion of the substrate through the aperture of said masking layer so as to form a hollow part therein; and (c) heat treating said silicon substrate at a temperature of from about 1100° C. to about 1200° C. and in a mixture gas comprising hydrogen, silicon halide whose mol percent to the hydrogen is between about 0.1 and 1.9, and hydrogen chloride whose mol percent to the hydrogen is between about 0.5 and 2.8, whereby a silicon epitaxial layer is grown only on the surface of the hollow part without substantially any growth on said silicon nitride mask; and wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns.

4. A method for forming a semiconductor component for a semiconductor circuit according to claim 3, wherein said heat treatment is carried out to the extent that said silicon epitaxial layer is grown to refill the hollow part of said silicon substrate.

5. A method for forming a semiconductor component for a semiconductor circuit according to claim 3, wherein an active impurity gas is further added to the mixture gas, said active impurity being capable of giving to the silicon epitaxial layer a second conductivity type opposite to that of said substrate when added therein, thereby forming a pn junction between said substrate and said epitaxial layer grown in the hollow part.

6. A method for fabricating a transistor semiconductor component for a semiconductor circuit comprising the steps of:

(a) forming a silicon nitride masking layer with at least one aperture upon one surface of a silicon substrate of first conductivity type to expose a desired surface portion of the substrate;

(b) vapor etching the surface portion of the substrate exposed by the aperture so as to form a hollow part in the substrate;

(c) forming a semiconductive layer of a second conductivity type opposite to said first conductivity type on the whole surface of the hollow part;

(d) heat treating said silicon substrate at a temperature of from about 1100° C. to about 1200° C. and in a mixture gas comprising hydrogen, silicon halide whose mol percent to the hydrogen is between about 0.1 and 1.9, and hydrogen chloride whose mol percent to the hydrogen is between about 0.5 and 2.8 and a first active impurity of a first conductivity type whereby a silicon epitaxial layer of the first conductivity type is grown in the whole surface of the hollow part without substantially any growth on said silicon nitride mask wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns; and (e) diffusing a second active impurity into a selected region of said silicon epitaxial layer so as to form a diffusion region of the second conductivity type.

7. A method for fabricating a transistor semiconductor component for a semiconductor circuit according to claim 6, wherein the step of forming said semiconductive layer of second conductivity type in the whole surface of the hollow part is carried out by heat treating the substrate in the mixture gas of $SiCl_4$, $H_2$, HCl and a third active impurity capable of giving the second conductivity type to said semiconductive layer.

8. A method for fabricating a transistor semiconductor component for a semiconductor circuit according to claim 6, wherein the step of forming said semiconductive layer of the second conductivity type in the whole surface of the hollow part is carried out by diffusing into the surface of the hollow part a third active impurity capable of giving the second conductivity type to the semiconductive layer.

9. A method for fabricating a transistor semiconductor component for a semiconductor circuit according to claim 6, wherein the step of forming said semiconductive layer of second conductivity type comprises the steps of diffusing into the surface of the hollow part a third active impurity capable of giving the second conductivity type to the high impurity concentration layer thus formed, and heat treating the substrate in the mixture gas of $SiCl_4$, $H_2$, HCl and a fourth active impurity capable of giving the other conductivity type to the low impurity concentration epitaxial layer thus formed.

10. A method for fabricating a resistance element for a semiconductor circuit comprising the steps of:

(a) forming a silicon nitride masking layer with at least one aperture upon one surface of a silicon substrate of first conductivity type;

(b) vapor etching a surface portion of the substrate exposed by the aperture of the masking layer so as to form a hollow part in the surface of the substrate;

(c) heat treating the substrate at a temperature of from about 1100° C. to about 1200° C. and in a mixture gas comprising hydrogen, silicon halide whose mol percent to the hydrogen is between about 0.1 and 1.9 and hydrogen chloride whose mol percent to the hydrogen is between about 0.5 and 2.8, and a first active impurity of a second conductivity type opposite to the first conductivity type whereby a silicon epitaxial layer of the second conductivity type is grown on whole surface of the hollow part until the hollow part is completely refilled with the silicon epitaxial layer wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns; and
(d) diffusing a second active impurity of the second conductivity type into the epitaxial layer at two apart portions to form two high impurity concentration regions of the second conductivity type acting as electrical contact regions for said resistance element.

11. A method for fabricating a semiconductor component for a semiconductor circuit comprising the steps of:
(a) forming a silicon nitride masking layer with at least an aperture upon one surface of a silicon substrate of first conductivity type;
(b) vapor etching a surface portion of the substrate exposed by the aperture of the masking layer so as to form a hollow part in the surface of said substrate;
(c) forming a semiconductor isolation layer of second conductivity type opposite to said first conductivity type on the surface of the hollow part;
(d) heat treating the substrate at a temperature of from about 1100° C. to about 1200° C. and in a mixture gas comprising hydrogen, silicon halide whose mol percent to the hydrogen is between about 0.1 and 1.9, and hydrogen chloride whose mol percent to the hydrogen is between about 0.5 and 2.8, and a first active impurity of the first conductivity type whereby a silicon epitaxial layer of the first conductivity type on the isolation layer to refill the hollow part wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns; and
(e) diffusing a second active impurity into two selected apart regions of the epitaxial layer of first conductivity so as to form two diffused regions, said second impurity being capable of giving the first conductivity type to said two diffused regions, whereby said two diffused regions, become two high concentration regions of the first conductivity type acting as the electrical contact regions for said semiconductor component.

12. A method for fabricating a semiconductor component for a semiconductor circuit according to claim 11, wherein said isolation layer is formed by diffusing a third active impurity into the whole surface of said hollow part, said third active impurity being capable of giving the second conductivity type to the isolation layer thus formed.

13. A method for fabricating a semiconductor component for a semiconductor circuit according to claim 11, wherein said isolation layer is formed by heat treating said substrate in the mixture gas of $SiCl_4$, $H_2$, HCl and a third active impurity, said third active impurity being capable of giving the second conductivity to the isolation layer thus formed.

14. A method for fabricating a semiconductor component for a semiconductor circuit according to claim 11, which further comprises a step of diffusing a third active impurity of the second conductivity type into said epitaxial layer of the first conductivity type between said two high concentration regions of the first conductivity type to control the width of said epitaxial layer of the first conductivity type.

15. A method for fabricating a semiconductor device including at least one transistor and a passive component comprising the steps of:
(a) forming a silicon nitride masking layer upon one surface of a silicon substrate of a first conductivity type, said silicon nitride masking layer having a first and a second aperture therein;
(b) vapor etching a first and a second surface portion of the silicon substrate exposed by the first and second apertures of the masking layer, respectively, so as to form first and second hollow parts in the surface of said substrate;
(c) forming a semiconductive layer of a second conductivity type opposite to the first conductivity type on each surface of the two hollow parts;
(d) heating the substrate at a temperature of from about 1100° C. to about 1200° C. and in a mixture gas comprising hydrogen, silicon halide whose mol percent to that of hydrogen is between about 0.1 and 1.9, hydrogen chloride whose mol percent of that of hydrogen is between about 0.5 and 2.8, and a first active impurity of the first conductivity type whereby first and second silicon epitaxial layers of the first conductivity type are grown on the semiconductor layers respectively to refill the hollow parts, wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns;
(e) diffusing a second active impurity of the second conductivity type into the selective region of the first epitaxial layer of the second conductivity type;
(f) diffusing a third active impurity of the first conductivity type in said first and second epitaxial layers so as to form a high concentration region of first conductivity type acting as the emitter in the first epitaxial layer and a high concentration region of first conductivity type as an acting as electrode of the resistance element.

16. A method for fabricating a semiconductor device including at least one transistor and a passive component according to claim 15, wherein said semiconductor layer is formed by diffusing a second active impurity into the whole surface of said hollow part.

17. A method for fabricating a semiconductor device including at least one transistor and a passive component according to claim 15, wherein said second conductivity layer is formed by heating said substrate in the mixture gas of $SiCl_4$, $H_2$, HCl and a second active impurity, said second active impurity being capable of giving the second conductivity to said second conductivity region when added therein.

18. A method for fabricating a semiconductor device including at least one transistor and a passive component according to claim 15, wherein said high concentration region of first conductivity type is formed by diffusing a third impurity in the second epitaxial layer, said high concentration region is spaced from each said semiconductor layer and two high concentration regions of first conductivity.

19. A method for fabricating a semiconductor device including at least one transistor and a passive component according to claim 18, wherein said high concentration regions in the second epitaxial layer are formed simultaneously with the formation of said high concentration region of the second conductivity type in the first epitaxial layer.

20. A method for forming a semiconductor component for a semiconductor circuit comprising the steps of:
(a) forming a silicon nitride masking layer with at least one aperture on one surface portion of a silicon substrate;

(b) vapor etching the exposed surface of the substrate through the aperture of said masking layer so as to form a hollow part therein; and (c) heat treating said silicon substrate at a temperature of from about 1100° C. to about 1200° C. and in a mixture gas comprising hydrogen, silicon halide whose mol percent to that of hydrogen is between about 0.1 and 1.9 and hydrogen chloride whose mol percent to that of hydrogen is between about 0.5 and 2.8 whereby a silicon epitaxial layer is grown only on the surface of the hollow part without substantially any growth on said silicon nitride mask;

wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 50 to 200 microns in which flat bottom etching occurs.

21. A method for fabricating a transistor semiconductor component for a semiconductor circuit comprising the steps of:

(a) forming a silicon nitride masking layer with at least one aperture upon one surface of a silicon substrate of first conductivity type to expose a desired surface portion of the substrate;

(b) vapor etching the surface portion of the substrate exposed by the aperture so as to form a hollow part in the substrate;

(c) forming a semiconductive layer of a second conductivity type opposite to said first conductivity type on the whole surface of the hollow part;

(d) heat treating said silicon substrate at a temperature of from about 1100° C. to about 1200° C. and in a mixture gas comprising hydrogen, silicon halide whose mol percent to that of hydrogen is between about 0.1 and 1.9 and hydrogen chloride whose mol percent to that of hydrogen is between 0.5 and 2.8 and a first active impurity of a second conductivity type, whereby a silicon epitaxial layer of the second conductivity type is grown in the whole surface of the hollow part without substantially any growth on said silicon nitride mask, wherein said silicon nitride masking layer is formed upon the (100) plane of said silicon substrate, said aperture of the silicon nitride masking layer being rectangular, each side thereof being parallel to the [110] crystal axis of said silicon substrate, and the length of each side of said aperture being in the range of 20 to 600 microns;

(e) diffusing a second active impurity into a selected region of said silicon epitaxial layer so as to form a diffusion region of the first conductivity type; and (f) diffusing a third active impurity of the second conductivity type into only a selected region of the diffusion region of the first conductivity type.

References Cited

UNITED STATES PATENTS

| | | | |
|---|---|---|---|
| 3,514,845 | 6/1970 | Legat et al. | 156—17 |
| 3,566,220 | 2/1971 | Post | 317—235 |
| 3,586,925 | 6/1971 | Collard | 317—234 |
| 3,370,995 | 2/1968 | Lowery et al. | 148—175 |
| 3,386,857 | 6/1968 | Steinmaier | 117—212 |
| 3,425,879 | 2/1969 | Shaw et al. | 148—175 |
| 3,438,873 | 4/1969 | Schmidt | 156—17 X |
| 3,447,235 | 6/1969 | Rosvold et al. | 29—578 |
| 3,455,020 | 7/1969 | Dawson et al. | 148—187 X |
| 3,456,169 | 7/1969 | Klein | 317—235 |
| 3,461,003 | 8/1969 | Jackson | 148—175 |
| 3,511,702 | 5/1970 | Jackson et al. | 117—212 |

OTHER REFERENCES

Shaw, D. W., "Selective Epitaxial Deposition . . .," J. Electrochemical Soc., vol. 113, No. 9, September 1966, pp. 904–908.

L. DEWAYNE RUTLEDGE, Primary Examiner
W. G. SABA, Assistant Examiner

U.S. Cl. X.R.

29—578, 580; 148—187; 156—17; 317—235 R